United States Patent
Nakayama et al.

(10) Patent No.: US 6,636,050 B2
(45) Date of Patent: Oct. 21, 2003

(54) FOUR-TERMINAL MEASURING DEVICE THAT USES NANOTUBE TERMINALS

(75) Inventors: Yoshikazu Nakayama, 7-19, Hanaten-nishi-2-chome, Joto-ku, Osaka-city, Osaka 536-0011 (JP); Akio Harada, Osaka (JP); Takashi Okawa, Osaka (JP); Toshikazu Nosaka, Osaka (JP)

(73) Assignees: Yoshikazu Nakayama, Osaka (JP); Daiken Chemical Co., Ltd., Osaka (JP)

( * ) Notice: Subject to any disclaimer, the term of this patent is extended or adjusted under 35 U.S.C. 154(b) by 0 days.

(21) Appl. No.: 09/905,551

(22) Filed: Jul. 13, 2001

(65) Prior Publication Data

US 2002/0084790 A1 Jul. 4, 2002

(30) Foreign Application Priority Data

Jul. 13, 2000 (JP) ........................................ 2000-249041

(51) Int. Cl.[7] .............................................. G01R 27/14
(52) U.S. Cl. ...................................... 324/537; 324/715
(58) Field of Search ............................... 324/762, 537, 324/715

(56) References Cited

U.S. PATENT DOCUMENTS

| | | | | | |
|---|---|---|---|---|---|
| 3,676,775 | A | * | 7/1972 | Dupnock et al. | 324/717 |
| 4,343,993 | A | * | 8/1982 | Binnig et al. | 250/306 |
| 5,217,907 | A | * | 6/1993 | Bulucea et al. | 148/DIG. 135 |
| 5,723,981 | A | * | 3/1998 | Hellemans et al. | 250/306 |
| 6,146,227 | A | * | 11/2000 | Mancevski | 445/24 |
| 6,218,846 | B1 | * | 4/2001 | Ludwig et al. | 324/713 |
| 6,401,526 | B1 | * | 6/2002 | Dai et al. | 423/447.3 |

* cited by examiner

Primary Examiner—N. Le
Assistant Examiner—Vincent Q. Nguyen
(74) Attorney, Agent, or Firm—Koda & Androlia

(57) ABSTRACT

A four-terminal measuring device, which uses nanotube terminals and measures low resistance values and low impedance values of extremely small objects under test with good precision, including two current terminals which cause a constant current to flow from a constant-current power supply to an object under test and two voltage terminals which measure the voltage across both ends of the object under test; and in this four-terminal measuring device, a nanotube terminal is formed by fastening the base end portion of a nanotube to a holder so that the tip end portion of the nanotube protrudes from the holder, and such a nanotube terminal is connected to desired terminals among the four terminals.

1 Claim, 4 Drawing Sheets

FOUR-TERMINAL MEASURING DEVICE THAT USES NANOTUBE TERMINALS

BACKGROUND OF THE INVENTION

1. Field of the Invention

The present invention relates to a four-terminal measuring device which measures a very small resistance or very small impedance of an object under test, and more specifically relates to a four-terminal measuring device which can measure extremely small regions of an object under test, or which can measure an object under test of extremely small size, by using nanotube terminals.

2. Prior Art

Conventionally, in order to measure the resistance Rx of an object under test, a method has been used in which a voltage is applied across both ends of the object under test, the current I flowing through the object under test and the voltage V across both ends of the object under test are measured, and then the resistance Rx is calculated using the formula Rx=V/I. A problem that has arisen in such cases is a generation of measurement error caused by the resistance of connecting wires such as lead wires, etc. and the contact resistance between the connecting terminals and the object under test.

FIG. 6 shows a conventional two-terminal measuring device which is used to measure the DC resistance of an object under test. Connecting wires 32 and 34 such as lead wires used for measurement, etc. are connected to connecting terminals C1 and C2 on both ends of the object under test 30, and a voltmeter 36, ammeter 38 and DC power supply 40 are connected to these connecting wires 32 and 34. The measured resistance Rm of the object under test is determined from the measured voltage V and current I as Rm=V/I=Rc1+Rx+Rc2+Rc, where Rx is the resistance of the object under test 30, Rc1 and Rc2 are the resistances of the connecting wires 32 and 34, and Rc is the contact resistance.

However, it is seen that the connecting wire resistances Rc1 and Rc2 and contact resistance Rc are admixed in this measured resistance Rm as errors. From the ratio of Rm/Rx, the error rate is given by (Rc1+Rc2+Rc)/Rx; accordingly, it is seen that the error rate increase abruptly as the resistance Rx of the object under test becomes very small. Consequently, the two-terminal measurement method is not suitable for the measurement of low resistance.

As a result, a four-terminal measuring device has been developed as a device for measuring low resistances. FIG. 7 is a circuit diagram of a four-terminal measuring device. Here, elements that are the same as in FIG. 6 are labeled with the same reference numeral, and only those elements that differ will be described. The connecting terminals C1 and C2 are respectively split in two, so that current terminals Ci1 and Ci2 and voltage terminals Cv1 and Cv2 are provided. Current connecting wires 42 and 44 and voltage connecting wires 46 and 48 are connected to these terminals as lead wires used for measurement. The resistances of the current connecting wires 42 and 44 are designated as Ri1 and Ri2, and the resistances of the voltage connecting wires 46 and 48 are designated as Rv1 and Rv2.

The effect as described in the following is obtained as a result of the provision of the current terminals Ci1 and Ci2 and voltage terminals Cv1 and Cv2. The current I flowing in the direction indicated by the arrow flows through the ammeter 38, current connecting wire 42, object under test 30, current connecting wire 44 and DC power supply 40, and thus returns to the starting point. Since the internal resistance of the voltmeter 36 is extremely large, there is almost no branching of the entreat I into the voltmeter 36; instead, the current flows "as is" into the object under test 30. Accordingly, the current I flowing through the object under test 30 may be viewed as being measured by the ammeter 38.

Meanwhile, since the internal resistance of the voltmeter 36 is far greater than the resistances Rv1 and Rv2 of the voltage connecting wires 46 and 48, the voltage drops caused by the voltage connecting wires 46 and 48 can be more or less ignored. Thus, the voltage V that is measured by the voltmeter 36 may be viewed as the voltage across both ends of the object under test 30.

Accordingly, the resistance Rx of the object under test 30 can be derived with good precision according to V/I from the current I and voltage V measured by the four-terminal measuring device. By changing from two terminals to four terminals, it becomes possible to ignore the connecting wire resistance and contact resistance. Thus, a four-terminal measuring device is an effective means to measure low resistances.

Such a four-terminal measuring device is certainly an effective device for measuring low resistances in oases where the object under test 30 is of a certain size or greater. FIG. 8 shows a resistance measurement diagram for a plate-form object under test in which a four-terminal measuring device is used. The constant-current power supply 43 is constructed by means of a DC power supply 40 and a constant-current resistance 41. The tip ends of the current connecting wires 42 and 44 (which are lead wires) are caused to contact the current terminals Ci1 and Ci2 of the plate-form object under test 30, and the tip ends of the voltage connecting wires 46 and 48 are caused to contact voltage terminals Cv1 and Cv2, which are disposed between the abovementioned terminals Ci1 and Ci2. Then, the resistance Rx of the object under test between the voltage terminals Cv1 and Cv2 is derived according to V/I. In this example, the current terminals Ci1 and Ci2 and voltage terminals Cv1 and Cv2 refer to the contact points where the current connecting wires 42 and 44 and voltage connecting wires 46 and 48 contact the object under test 30.

The current connecting wires 42 and 44 and voltage connecting wires 46 and 48 are lead wires whose tip ends are caused to contact the object under test 30. Accordingly, as the size of the object under test 30 becomes smaller, it becomes necessary to reduce the size of the lead wires. Even though the points of current terminals Ci1 and Ci2 shift somewhat in the right or left direction of the object under test 30, a constant current I flows between the voltage terminals Cv1 and Cv2. Accordingly, there is no great problem even if the current terminals Ci1 and Ci2 are in a state of surface contact with the surface of the object under test 30. However, because of precision requirements, the voltage terminals Cv1 and Cv2 must be single points in order to give both ends of the resistance that is being measured.

In other words, it is necessary to reduce the size of the tip ends of the voltage connecting wires. However, in conventional measuring devices, there are naturally limits to this size reduction. For example, even if the tip end of a metal needle is subjected to a sharpening treatment by means of electrolytic polishing, etc. or to an etching treatment using a semiconductor technique, it is difficult to reduce the size of the tip end to a nano-scale size. Meanwhile, as ultra-high densities have been developed in semiconductor techniques, objects under test have become progressively smaller.

Today, for example, attempts have been made to manufacture nano-size electronic circuits, and resistance measurements and impedance measurements in the nano-region have become an absolute necessity. With conventional four-terminal measuring devices, it is absolutely impossible to handle such extremely small resistance measurements.

SUMMARY OF THE INVENTION

Accordingly, the object of the present invention is to provide a four-terminal measuring device that measures, with a use of extremely small nanotube, extremely small resistances or extremely small impedance values with good precision even in cases where the object under test itself is extremely small or the region being measured is extremely small.

More specifically, the present invention relates to a four-terminal measuring device that uses nanotube terminals and is characterized in that one or more of the tip end portions of the contact terminals of the four-terminal measuring device is formed by a nanotube.

Furthermore, the present invention relates to a four-terminal measuring device that uses nanotube terminals and is characterized in that the four-terminal measuring device is comprised of two current terminals which cause a constant current to flow from a constant-current power supply to an object under test and two voltage terminals which measure the voltage across both ends of the object under test; and in such a four-terminal measuring device, a nanotube terminal is formed by fastening the base end portion of a nanotube to a holder so that the tip end portion of the nanotube protrudes from the holder, and such a nanotube terminal is connected to desired terminals among four terminals.

In the present invention which is for a four-terminal measuring device that uses nanotube terminals, the nanotube terminal is connected to at least the voltage terminals among four terminals.

Furthermore, in the present invention which is for a four-terminal measuring device that uses nanotube terminals, the holder is a pyramid portion of an AFM cantilever.

In addition, in the present invention which is for a four-terminal measuring device that uses nanotube terminals, the constant-current power supply is formed by a DC power supply, and a voltmeter is formed by a DC voltmeter, thus measuring a very small resistance of the object under test.

In the present invention, further, which is for a four-terminal measuring device that uses nanotube terminals, the constant-current power supply is formed by an AC power supply, and a voltmeter is formed by an AC voltmeter, thus measuring a very small impedance of the object under test.

DETAILED DESCRIPTION OF THE INVENTION

Figure 1:
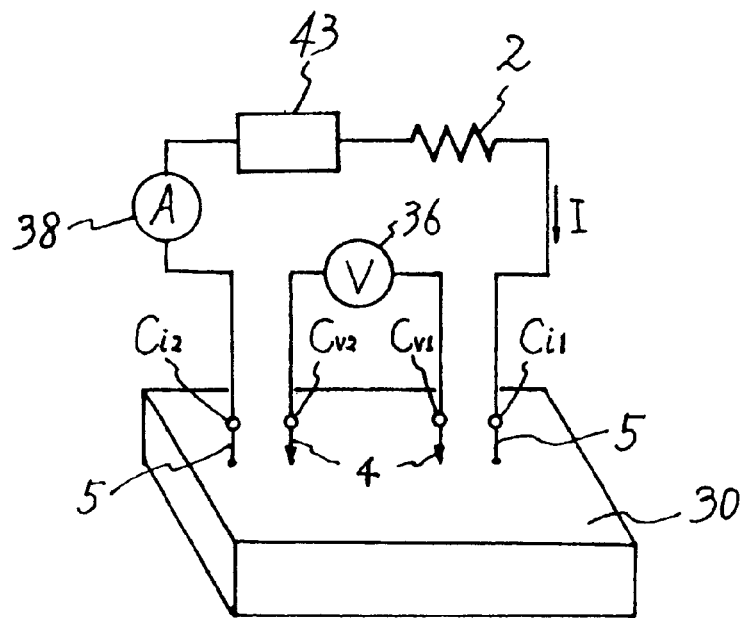
FIG. 1 is a schematic structural diagram that illustrates a first example of the four-terminal measuring device that uses nanotube terminals provided by the present invention.

As a result of diligent research conducted for the purpose of reducing the measurement terminals of a four-terminal measuring device to an ultra-small size, the inventors of the present application hit upon the concept of using nanotubes as measurement terminals. The cross-sectional diameters of nanotubes are on the order of nanometers, and the axial lengths of nanotubes range from nano-size to micron-size. Accordingly, such nanotubes are optimal as measurement terminals that are caused to contact the surfaces of extremely small objects under test.

The firstly discovered nanotubes were carbon nanotubes (also called CNT). These nanotubes were discovered in the deposits of arc discharges using carbon. Carbon nanotubes possess conductivity and have cross-sectional diameters that are distributed over a range of approximately one nanometer to several tens of nanometers. Furthermore, the axial lengths of carbon nanotubes range from nano-size to micron-size. Accordingly, such carbon nanotubes are optimal as the measurement terminals of the present invention.

Following the synthesis of carbon nanotubes, BCN type nanotubes were synthesized. For example, a mixed powder of amorphous boron and graphite is packed into a graphite rod, and this mixture is evaporated in a nitrogen gas atmosphere. Alternatively, a sintered BN rod is packed into a graphite rod and is evaporated in a helium gas atmosphere. As another alternative, an arc discharge is performed in a helium gas atmosphere using $BC_4N$ as an anode and graphite as a cathode. BCN type nanotubes in which some of the C atoms in CNT are replaced by B atoms and N atoms have been synthesized by these methods.

Furthermore, BN type nanotubes have also been synthesized. These are nanotubes that contain almost no C atoms. For example, CNT and powdered $B_2O_3$ are placed in a crucible and heated in nitrogen gas. As a result, BN type nanotubes in which almost of the C atoms in the CNT are replaced by B atoms and N atoms are synthesized.

Since both BCN type nanotubes and BN type nanotubes have a physical structure that is more or less similar to that of CNT, the ratio of the axial length to the diameter, i.e., the aspect ratio, is also extremely high in such nanotubes. Since these nanotubes can be endowed with conductivity by forming a metal coating film on the surface of the nanotube, such nanotubes can be used along with carbon nanotubes as the measurement terminals of the present invention.

In the present invention, a nanotube terminal is constructed by fastening the base end portion of a nanotube to a holder so that the tip end portion of the nanotube is caused to protrude from the holder, and this nanotube terminal is used as a measurement terminal. In order to accomplish firm fastening of the nanotube to the holder, a means such as coating the base end portion of the nanotube with a coating film or thermally fusing the base end portion of the nanotube to the holder, etc. is adopted.

The above fastening method will be described in detail. The nanotube and holder are placed in, for example, an electron microscope, and the vicinity of the base end portion of the nanotube is irradiated with an electron beam while the bonded state of such two elements is imaged under magnification. As a result, the impurity gas inside the microscope is broken down, and a carbon film is formed so as to cover the base end portion of the nanotube. Then, the base end portion of the nanotube is fastened to the holder by this coating film. Alternatively, if the base end portion of the nanotube is directly irradiated with an electron beam, this base end portion is fastened to the holder by thermal fusion.

For example, a pyramid portion of an AFM cantilever can be used as the holder to which the nanotube is fastened. The "pyramid portion" is a term that collectively refers to protruding portions used for measurement in cantilevers. The pyramid portion may have various shapes such as a circular conical shape, triangular pyramid shape, square pyramid shape, etc. In other words, the "pyramid portion" refers collectively to all shapes of protruding portions used in AFM cantilevers. Besides AFM cantilevers, holders and other members of other scanning probe microscopes such as STM, etc. may also be utilized as holders.

Below, examples of the four-terminal measuring device that uses nanotube terminals provided by the present invention will be described in detail with reference to the attached Figures.

FIG. 1 is a schematic structural diagram that illustrates a first example of the four-terminal measuring device that uses nanotube terminals provided by the present invention. The diagram illustrates a case in which the voltage drop method is used. Ordinary terminals 5 consisting of metal needles are disposed in contact with the surface of the object under test 30 from current terminals Ci1 and Ci2, and these ordinary terminals 5, 5 are fastened to the surface of the object under test 30. Nanotube terminals 4, 4 of the present invention are disposed in contact with the surface of the object under test 30 from voltage terminals Cv1 and Cv2. Since these nanotube terminals 4, 4 are disposed so as to be free to move relative to the surface of the object under test 30, the tip ends of these terminals are shown as arrowhead symbols in the Figure.

A current I flows in the direction indicated by the arrow from a constant-current power supply 43. The current is measured by an ammeter 38, and the voltage across the voltage terminals Cv1 and Cv2 is measured by a voltmeter 36. The standard resistance 2 is another current measurement means. In this case, the current is derived by measuring the voltage across the two terminals of this standard resistance.

Figure 2:
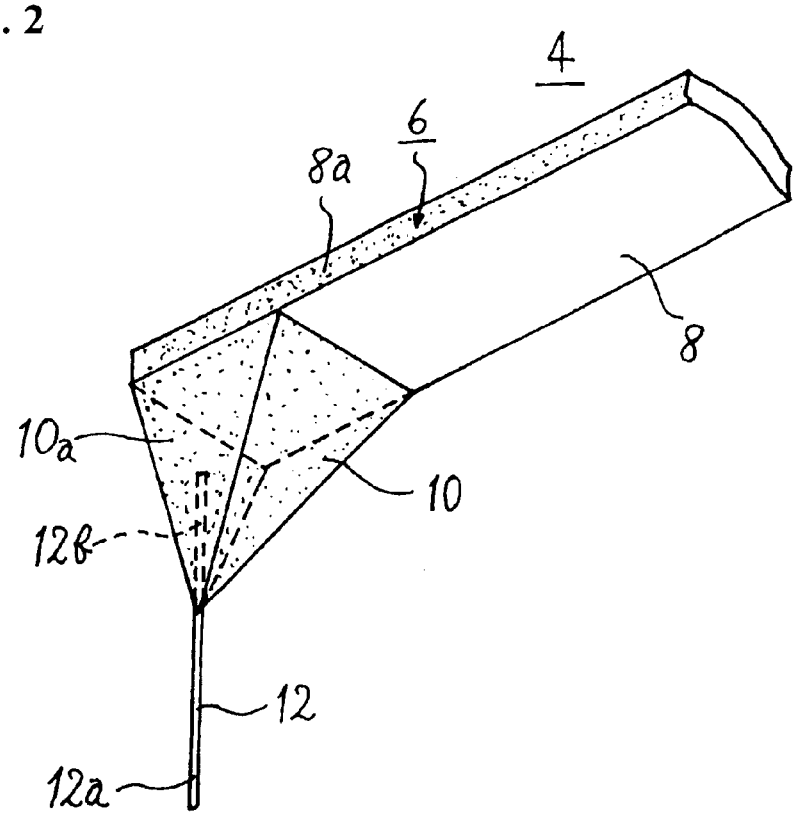
FIG. 2 is a schematic perspective view of one of the nanotube terminals used in the present invention.

FIG. 2 is a schematic perspective view of a nanotube terminal 4. Here, a cantilever 6 used for AFM measurement is employed, and the protruding portion used for measurement at the tip end of this cantilever part 8, i.e., the so-called pyramid portion, acts as a holder 10. The structure here is one in which the base end portion 12b of a nanotube 12 is fastened to the surface of this holder 10, and the tip end portion 12a of this nanotube 12 is caused to protrude. The tip end portion 12a corresponds to the tip end arrowhead symbol of the nanotube terminal 4.

Since this nanotube 12 is a carbon nanotube, the nanotube 12 possesses conductivity. Furthermore, a metal film 10a is formed on the surface of the holder 10, and electrode films 8a are formed on the side surfaces of the cantilever part 8. Accordingly, there is electrical continuity from the nanotube 12 to the electrode films 8a. The cantilever part 8 is connected to the voltage terminals Cv1 and Cv2 by elements not shown in the Figure. Accordingly, the nanotube 12 is connected to the circuit shown in FIG. 1.

Figure 3:
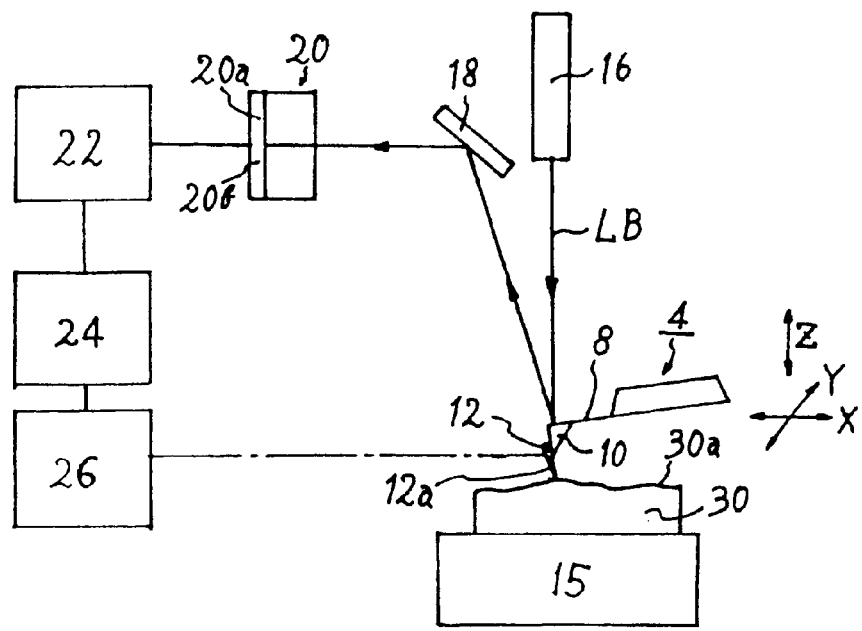
FIG. 3 is a diagram that shows the driving structure of the nanotube terminals connected to the voltage terminals.

FIG. 3 is a diagram that shows the driving structure of the nanotube terminals 4 connected to the voltage terminals Cv1 and Cv2. The object under test 30 is placed on a sample holder 15, and each nanotube 12 is disposed so that the tip end portion 12a of this nanotube 12 contacts the surface 30a of the object under test 30. The nanotube terminals 4 are scanned in the X, Y and Z directions by means of an XYZ scanning circuit 26, so that the nanotubes 12 can be moved to an desired position on the surface 30a of the object under test 30.

The degree of contact of each nanotube 12 with the surface 30a is adjusted by laser light. The back surface of the cantilever part 8 is illuminated by a laser beam LB from a semiconductor laser device 16, and the resulting reflected light is introduced into a two-part split detector 20 by a reflective mirror 18. This two-part split detector 20 comprised of an upper detector 20a and a lower detector 20b. The amount of flexing of the cantilever part 8 is measured according to the amounts of incident light on these detectors, so that the degree of contact is measured. In other words, a Z-axis adjustment is performed for each nanotube terminal 4 so that the amount of flexing of the cantilever part 8 is always constant.

Since the surface 30a of the object under test 30 has indentations and projections, the Z-axis adjustment is constantly performed when each nanotube terminal 4 moves in the X and Y directions. The amount of movement along the Z-axis is measured by a Z-axis detection circuit 22, and the state of indentations and projections on the surface 10a of the object under test 30 is displayed by a display device 24 on the basis of data from the XYZ scanning circuit 26 and Z-axis detection circuit 22.

The two nanotube terminals 4 connected to the voltage terminals Cv1 and Cv2 are respectively driven by the driving device shown in FIG. 3. Accordingly, the resistance between arbitrary positions on the object under test 30 can be precisely measured. If the object under test 30 is a semiconductor, then a check can be made in order to ascertain whether or not the semiconductor has been manufactured so that the resistance between two arbitrary positions on the semiconductor corresponds to the designed value. Since nanotubes 12 have a cross-sectional diameter of one nanometer to several tens of nanometers, to two nanotubes 12, 12 can be caused to face each other across a gap of several nanometers at the smallest. Thus, very small resistances over a distance of a few nanometers on the object under test 30 can be measured.

Figure 4:
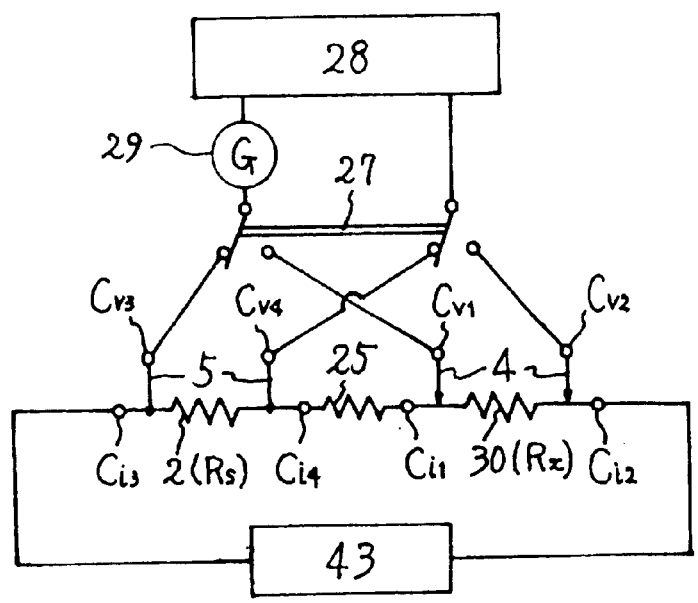
FIG. 4 is a schematic structural diagram that illustrates a second example of the four-terminal measuring device that uses nanotube terminals provided by the present invention.

FIG. 4 is a schematic structural diagram of a second example of the four-terminal measuring device that uses nanotube terminals provided by the present invention. In this diagram, the potentiometer method is shown. Current terminals Ci1 and Ci2 and voltage terminals Cv1 and Cv2 are located at both ends of an object under test 30 which has a resistance of Rx. Likewise, current terminals Ci3 and Ci4 and voltage terminals Cv3 and Cv4 are located at both ends of a standard resistance 2 which has a resistance of Rs.

A connecting wire 25 with a resistance of r is connected between the current terminals Ci1 and Ci4. Nanotube terminals 4 of the present invention are connected to the voltage terminals Cv1 and Cv2 located at both ends of the object under test 30, and ordinary terminals 5, 5 are connected to the voltage terminals Cv3 and Cv4 located at both ends of to standard resistance 2.

Both ends of the object under test 30 and the standard resistance 2 are switched by means of an interlock switch 27, and the respective voltages Vx and Vs across both ends are measured by a potentiometer 28 and a galvanometer 29. Since a constant current I flows from the constant-current power supply 43, Vx=IRx and Vs=IRs hold true. Accordingly, the resistance Rx of the object under test can be determined according to Rx=RsVx/Vs. The resistance r of the connecting wire 25 does not appear in to expression.

Figure 5:
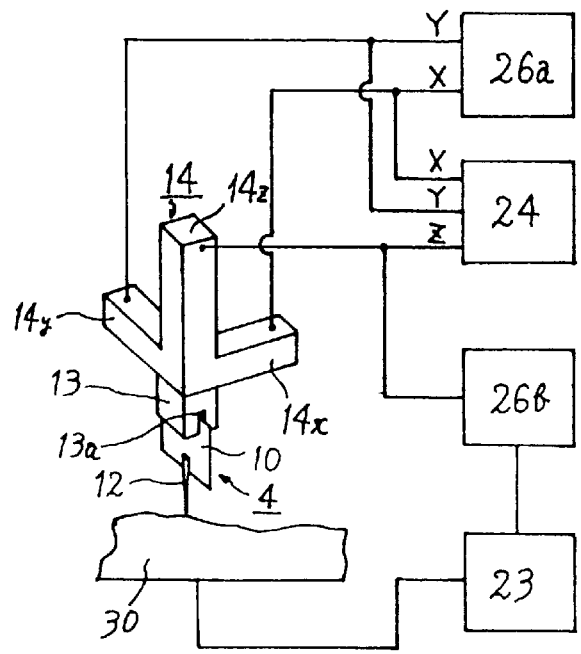
FIG. 5 is a diagram that shows the driving structure of the nanotube terminals in the second example.
Figure 6:
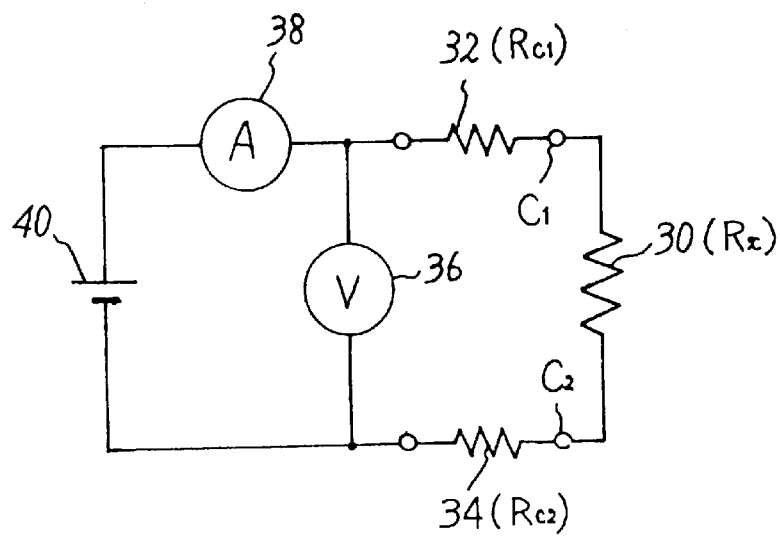
FIG. 6 is a conventional two-terminal measuring device that measures the DC resistance values of objects under test.
Figure 7:
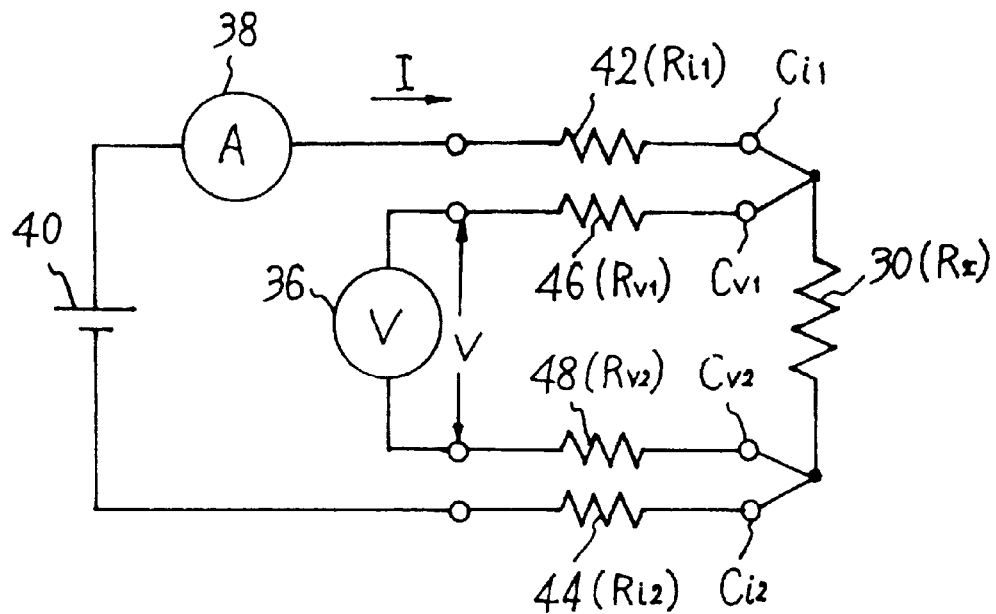
FIG. 7 is a circuit diagram of a conventional four-terminal measuring device.
Figure 8:
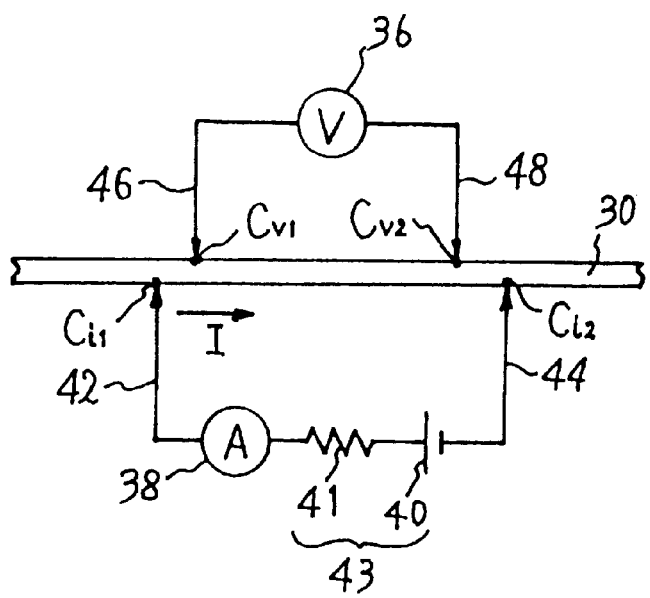
FIG. 8 is a resistance measurement diagram for a plate-form object under test that is measured with a use of a conventional four-terminal measuring device.

FIG. 5 illustrates the driving structure of the nanotube terminals 4 in the second example. Each nanotube terminal 4 is obtained by fastening a nanotube 12 to a flat-plate-form holder 10, and this holder 10 is inserted and fastened in the cut groove 13a of a holder set section 13. The holder set section 13 is connected to a scan drive section 14, and this scan drive section 14 is constructed from an X piezoelectric element 14x, a Y piezoelectric element 14y and a Z piezoelectric element 14z. The tip end 12a of the nanotube 12 can be moved to any desired position on the object under test 30 when these piezoelectric elements expand and contract.

Each nanotube terminal 4 is moved to the appropriate XY position by an XY scanning circuit 26a; and in this position, the nanotube 12 is moved in the Z direction so that the nanotube 12 is caused to approach the surface 30a of the object under test 30. Since a tunnel current is caused to flow when the nanotube is caused to approach within a certain distance, the tunnel current is detected by a tunnel current detection circuit 23, and the Z-direction movement of the nanotube 12 is stopped by a Z-direction scanning circuit 26b so that the tunnel current has a fixed value. These XYZ signals are sent to the display device 24, and an image of the indentations and projections on to surface of the object under test 30 is shown on the display device 24. From this position, the nanotube 12 is caused to approach even more closely to the surface 30a of the object under test 30. Then, the nanotube 12 is caused to contact the surface 30a of the object under test 30, and the resistance is measured.

Thus, in the second example, the nanotube terminals 4 can be set at arbitrary positions on the surface while the indentations and projections on the surface 30a of the object under test 30 are imaged, and the resistance between these positions are measured. Since the cross-sectional diameter of the nanotubes 12 ranges from one nanometer to several tens of nanometers, resistance measurements over a distance of several nanometers at the smallest are possible.

In the above-described examples, a DC power supply, a DC voltmeter and a DC ammeter are used. Accordingly, it is possible to measure the DC resistance of the object under test. However, if an AC power supply, AC voltmeter and AC ammeter are used, low impedance values of objects under test can be measured, and the measurement of inductance values L and electrical capacitance values C is also possible. Thus, the present invention provides a four-terminal measuring device that can perform accurate measurements of low resistance values and low impedance values.

Furthermore, in the above examples, nanotube terminals are connected only to the voltage terminals. However, it is also possible to connect nanotube terminals to the current terminals as well. If this is done, it becomes easier to cause the current terminals and voltage terminals to approach each other on the surface of the object under test, and the precision of resistance measurements can be improved. More specifically, in cases where an object under test is a planar substance, the current tends to diffuse, so that the current flowing between the voltage terminals and the current flowing between the current terminals are not necessarily equal. When measurements are performed with the current terminals and voltage terminals positioned in close proximity to each other, the precision of resistance measurements increases.

The voltage terminals and current terminals that contact the surface of the object under test are referred to collectively as contact terminals. If this term is used, then the present invention is a device that uses a nanotube terminal for at least one of these contact terminals. The number of nanotube terminals can be varied in accordance with the object under test and the measurement environment.

The present invention is not limited to the above-described examples. Various modifications, design alterations and the like that do not involve any departure from the technical concept of the present invention are included in the technical scope of the present invention.

As seen from the above, in the present invention, a nanotube is used as a tip end of at least one contact terminal. Accordingly, high-precision resistance and impedance measurements can be performed in accordance with the object under test and the measurement environment.

In the present invention, nanotube terminals are connected to desired terminals among the voltage terminals and current terminals. Accordingly, resistance measurements can be performed on nano-size objects under test and in nano-size measurement regions by means of these nanotube terminals.

In the present invention, at least the voltage terminals are constructed from nanotube terminals. Accordingly, voltage measurements can be accurately performed on nano-size objects under test and in nano-size measurement regions. Thus, resistances can be measured with high precision.

In the present invention, the pyramid portion of an AFM cantilever is utilized as a holder to which the nanotube is fastened. Accordingly, nanotube terminals can easily be constructed, and a driving device of the cantilever can be applied "as is" to the measurement of resistances.

In the present invention, extremely small DC resistances of objects under test can be measured using a DC power supply, a DC ammeter and an AC voltmeter.

In the present invention, extremely small impedance values of objects under test can be measured using an AC power supply, an AC ammeter and an AC voltmeter.

What is claimed is:

1. A four-terminal measuring device that uses nanotube terminals wherein said four-terminal measuring device is comprised of:

two current terminals which cause a constant current to flow from a constant-current power supply to an object under test, and two voltage terminals which measure a voltage across both ends of said object under test, and wherein a nanotube terminal comprising a base end portion of a nanotube fastened on a metal film of a holder of a cantilever by a coating film or thermal fusion so that a tip end portion of said nanotube protrudes from said holder and an electrode film of said cantilever electrically connected to said metal film so that said nanotube is electrically connected to said electrode film, and said nanotube terminals are connected to at least two voltage terminals so that a voltage across said tip end portions of said nanotubes is measured.

* * * * *